United States Patent
Lee et al.

(10) Patent No.: US 11,581,239 B2
(45) Date of Patent: Feb. 14, 2023

(54) LEAD-FREE SOLDER PASTE AS THERMAL INTERFACE MATERIAL

(71) Applicant: INDIUM CORPORATION, Utica, NY (US)

(72) Inventors: Ning-Cheng Lee, New Hartford, NY (US); Runsheng Mao, Clinton, NY (US); Sihai Chen, New Hartford, NY (US); Elaina Zito, Utica, NY (US); David Bedner, New Hartford, NY (US)

(73) Assignee: INDIUM CORPORATION, Utica, NY (US)

( * ) Notice: Subject to any disclaimer, the term of this patent is extended or adjusted under 35 U.S.C. 154(b) by 54 days.

(21) Appl. No.: 16/778,736

(22) Filed: Jan. 31, 2020

(65) Prior Publication Data

US 2020/0235033 A1    Jul. 23, 2020

Related U.S. Application Data

(63) Continuation-in-part of application No. 16/251,481, filed on Jan. 18, 2019.

(51) Int. Cl.
*B23K 35/00*    (2006.01)
*H01L 23/373*    (2006.01)
(Continued)

(52) U.S. Cl.
CPC ........ *H01L 23/3736* (2013.01); *B23K 35/025* (2013.01); *B23K 35/262* (2013.01);
(Continued)

(58) Field of Classification Search
CPC ... H01L 23/3736; H01L 23/367; H01L 23/42; H01L 23/3677; B23K 35/0244–025;
(Continued)

(56) References Cited

U.S. PATENT DOCUMENTS

| 4,834,794 A | 5/1989 | Yagi et al. |
| 5,382,300 A | 1/1995 | Blonder et al. |

(Continued)

FOREIGN PATENT DOCUMENTS

| CN | 1982405 A | 6/2007 |
| CN | 102656247 A | 9/2012 |

(Continued)

OTHER PUBLICATIONS

Final Office Action dated Feb. 16, 2021 for U.S. Appl. No. 16/251,481, filed Jan. 18, 2019.

(Continued)

*Primary Examiner* — Kiley S Stoner
(74) *Attorney, Agent, or Firm* — Sheppard, Mullin, Richter & Hampton LLP

(57) ABSTRACT

Some implementations of the disclosure are directed to a thermal interface material. In some implementations, a method comprises: applying a solder paste between a surface of a heat generating device and a surface of a heat transferring device to form an assembly; and reflow soldering the assembly to form a solder composite, wherein the solder composite provides a thermal interface between the heat generating device and the heat transferring device, wherein the solder paste comprises: a solder powder; particles having a higher melting temperature than a soldering temperature of the solder paste, wherein the solder paste has a volume ratio of solder powder to high melting temperature particles between 5:1 and 1:1.5; and flux.

11 Claims, 16 Drawing Sheets

(51) Int. Cl.
| | |
|---|---|
| *B23K 35/02* | (2006.01) |
| *B23K 35/26* | (2006.01) |
| *B23K 35/362* | (2006.01) |
| *H01L 23/367* | (2006.01) |
| *B23K 35/30* | (2006.01) |
| *B23K 101/40* | (2006.01) |

(52) U.S. Cl.
CPC .......... *B23K 35/302* (2013.01); *B23K 35/362* (2013.01); *H01L 23/367* (2013.01); *B23K 2101/40* (2018.08)

(58) Field of Classification Search
CPC .. B23K 35/302; B23K 35/262; B23K 35/362; B23K 2101/40; B23K 3/0638; B23K 35/26–268
USPC .......................... 228/248.1–248.5; 148/23–24
See application file for complete search history.

(56) References Cited

U.S. PATENT DOCUMENTS

| | | | |
|---|---|---|---|
| 5,415,944 A | 5/1995 | Kazem-Goudarzi et al. | |
| 5,429,293 A | 7/1995 | Bradley, III et al. | |
| 5,540,379 A | 7/1996 | Kazem-Goudarzi et al. | |
| 5,803,340 A | 9/1998 | Yeh et al. | |
| 5,837,356 A | 11/1998 | Katori et al. | |
| 7,017,795 B2 | 3/2006 | Liu et al. | |
| 7,789,288 B1* | 9/2010 | Johnson | C22C 19/05 228/119 |
| 9,162,324 B2 | 10/2015 | Nakano et al. | |
| 2002/0100986 A1 | 8/2002 | Soga et al. | |
| 2002/0175403 A1 | 11/2002 | Sreeram et al. | |
| 2003/0077478 A1* | 4/2003 | Dani | H01L 23/42 428/673 |
| 2003/0224197 A1* | 12/2003 | Soga | B23K 35/0244 428/570 |
| 2004/0151885 A1* | 8/2004 | Jayaraman | H01L 23/42 428/210 |
| 2004/0177997 A1 | 9/2004 | Hata et al. | |
| 2004/0217152 A1 | 11/2004 | Taguchi et al. | |
| 2005/0092819 A1* | 5/2005 | Liu | H05K 3/3485 228/248.1 |
| 2006/0261131 A1 | 11/2006 | Hirata et al. | |
| 2007/0245852 A1 | 10/2007 | Takaoka et al. | |
| 2009/0220812 A1* | 9/2009 | Kato | B23K 35/26 428/548 |
| 2010/0089498 A1* | 4/2010 | Ikeda | B23K 35/262 148/22 |
| 2010/0148374 A1 | 6/2010 | Castro | |
| 2011/0278051 A1 | 11/2011 | Himori et al. | |
| 2011/0290549 A1 | 12/2011 | Hirai et al. | |
| 2012/0156512 A1* | 6/2012 | Nakano | H01L 24/83 428/457 |
| 2012/0187556 A1* | 7/2012 | Nguyen | C08G 59/226 252/76 |
| 2012/0211549 A1 | 8/2012 | Yamakami et al. | |
| 2012/0248176 A1* | 10/2012 | Herron | B23K 35/30 228/248.1 |
| 2012/0248616 A1* | 10/2012 | Kitajima | B23K 35/0244 257/772 |
| 2013/0008698 A1* | 1/2013 | Himori | H05K 3/4069 174/251 |
| 2013/0062107 A1 | 3/2013 | Higuchi et al. | |
| 2013/0068513 A1 | 3/2013 | Hirai et al. | |
| 2013/0233618 A1* | 9/2013 | Nakano | C22C 1/0483 174/94 R |
| 2013/0270001 A1* | 10/2013 | Nakano | B23K 35/025 174/84 R |
| 2013/0299236 A1* | 11/2013 | Nakano | H05K 3/3463 174/84 R |
| 2014/0008104 A1 | 1/2014 | Sugaya et al. | |
| 2014/0054766 A1* | 2/2014 | Hashino | B23K 35/025 257/737 |
| 2014/0071639 A1 | 3/2014 | Honjo et al. | |
| 2014/0110153 A1* | 4/2014 | Kashiwagi | C22C 30/02 174/251 |
| 2014/0124250 A1 | 5/2014 | Iwasaki et al. | |
| 2014/0124925 A1* | 5/2014 | Sidhu | B23K 35/262 257/738 |
| 2014/0178703 A1* | 6/2014 | Nakano | B23K 35/025 428/457 |
| 2014/0193650 A1* | 7/2014 | Nakano | B23K 35/025 428/457 |
| 2014/0332116 A1* | 11/2014 | Hwang | B22F 1/0003 148/24 |
| 2014/0345939 A1* | 11/2014 | Nakano | B23K 35/0216 174/94 R |
| 2014/0356055 A1* | 12/2014 | Nakano | B23K 35/302 403/271 |
| 2014/0363221 A1* | 12/2014 | Nakano | B23K 35/262 403/272 |
| 2015/0115452 A1* | 4/2015 | Yoon | B23K 20/233 257/762 |
| 2015/0279804 A1* | 10/2015 | Raravikar | H01L 24/17 257/737 |
| 2016/0158897 A1* | 6/2016 | Koroki | C22C 13/02 148/24 |
| 2016/0163668 A1* | 6/2016 | Hine | H01L 24/00 174/257 |
| 2017/0095891 A1 | 4/2017 | Anderson et al. | |
| 2017/0179068 A1* | 6/2017 | Arvin | B23K 35/3033 |
| 2017/0186665 A1* | 6/2017 | Choudhury | H01L 23/3735 |
| 2018/0015572 A1* | 1/2018 | Kawasaki | B23K 35/0244 |
| 2018/0287032 A1 | 10/2018 | Lee et al. | |
| 2019/0001408 A1* | 1/2019 | Kawaguchi | B22F 1/0085 |
| 2019/0001444 A1* | 1/2019 | Kawaguchi | B23K 35/262 |
| 2019/0009375 A1* | 1/2019 | Hayashi | H05K 3/3463 |
| 2019/0084093 A1 | 3/2019 | Sakata et al. | |
| 2019/0182966 A1* | 6/2019 | Yamamoto | B23K 35/3618 |
| 2019/0375053 A1* | 12/2019 | Kawasaki | B23K 35/025 |
| 2019/0375054 A1* | 12/2019 | Kawasaki | B23K 35/3602 |
| 2019/0376161 A1* | 12/2019 | Kawasaki | H05K 3/3485 |
| 2020/0094354 A1 | 3/2020 | Misumi et al. | |
| 2020/0194335 A1* | 6/2020 | Eid | H01L 24/32 |
| 2020/0219786 A1* | 7/2020 | Hung | H01L 21/4882 |
| 2020/0227335 A1* | 7/2020 | Eid | H01L 28/40 |
| 2020/0227336 A1* | 7/2020 | Eid | H01L 23/42 |
| 2020/0235033 A1 | 7/2020 | Lee et al. | |
| 2020/0235082 A1* | 7/2020 | Eid | H01L 21/4882 |
| 2020/0312782 A1* | 10/2020 | Eid | H01L 23/42 |
| 2020/0312796 A1* | 10/2020 | Braunisch | H01L 21/4882 |
| 2020/0398383 A1* | 12/2020 | Shiraishi | B23K 1/0016 |
| 2021/0057354 A1* | 2/2021 | Eid | B33Y 80/00 |
| 2021/0154775 A1* | 5/2021 | Daoud | B23K 35/0238 |

FOREIGN PATENT DOCUMENTS

| | | |
|---|---|---|
| CN | 104625466 A | 5/2015 |
| CN | 106573344 | 4/2017 |
| WO | WO 2014/168026 | 10/2014 |
| WO | WO 2018/025903 | 2/2018 |
| WO | WO-2018025903 A1 * | 2/2018 .............. C22C 9/02 |

OTHER PUBLICATIONS

Second Office Action dated Sep. 22, 2022 for Chinese Application No. 202110127991.X.

* cited by examiner

LEAD-FREE SOLDER PASTE AS THERMAL INTERFACE MATERIAL

CROSS-REFERENCE TO RELATED APPLICATIONS

This application is a continuation-in-part of and claims priority to U.S. patent application Ser. No. 16/251,481 filed Jan. 18, 2019 and titled "LEAD-FREE SOLDER PASTE FOR THERMAL VIA FILLING," which is incorporated herein by reference in its entirety.

DESCRIPTION OF THE RELATED ART

The thermal performance of a printed circuit board (PCB) assembly is an important quality factor in electronic packaging. Often, the PCB substrate layer has the highest thermal resistance in the entire thermal path in the PCB assembly. Accordingly, minimizing the thermal resistance of the PCB substrate layer may provide the greatest benefit for heat dispassion.

One approach for reducing the thermal resistance of the PCB substrate layer is to add a thermal via. In a PCB, a vertical interconnect access or via may refer to a hole that provides an electrical connection between two or more layers of a PCB. The hole may be made conductive by electroplating, or by lining it with a tube or rivet. A via may be implemented as a through hole exposed on both sides of the board, a blind via hole exposed on one side of the board, or a buried via hole that connects internal layers without being exposed to either surface of the board.

A thermal via may refer to a via that provides a thermal path for heat flow away from the PCB substrate layer, due to the high thermal conductivity material used in the via compared to the rest of the substrate. Adding one or more thermal vias in a substrate layer may reduce thermal resistance in the PCB substrate layer, preventing overheating of the PCB assembly components. Thermal vias may be filled with a via filling material that is electrically conductive or nonconductive. The filling of thermal vias may be realized by technologies such as copper plating, nanomaterial sintering, thermal paste curing, and the like.

Another important factor in the performance of electronic assemblies is thermal management via a thermal interface material (TIM). With the growth of faster, more powerful devices, there is a need for improved TIMs. TIMs that have been used in the past include thermal greases, thermal gels, phase-changing materials, solder preforms, and liquid solders. These TIMs have suffered because of poor conductivity and/or performance issues such as pump-out or building of liquid solder dam. For example, although thermal greases have been widely available on the market as a TIM due to their good thermal performance upon installation, upon extended use and over time, these greases can degrade, resulting in higher thermal resistance at the interface. This impairs the transfer of heat away from the semiconductor device. This problem has been attributed, in part, to "pump-out." The powering up and down of the devices causes a relative motion between the die and the heat-spreader due to their different coefficients of thermal expansion. This can tend to "pump" out the paste from the interface gap.

BRIEF SUMMARY OF EMBODIMENTS

Some implementations of the disclosure are directed to an improved thermal interface material.

In one embodiment, a method comprises: applying a solder paste between a surface of a heat generating device and a surface of a heat transferring device to form an assembly; and reflow soldering the assembly to form a solder composite, wherein the solder composite provides a thermal interface between the heat generating device and the heat transferring device, wherein the solder paste comprises: a solder powder; particles having a higher melting temperature than a soldering temperature of the solder paste, wherein the solder paste has a volume ratio of solder powder to high melting temperature particles between 5:1 and 1:1.5; and flux.

In some implementations, the particles comprise a copper or copper-alloy powder, wherein during reflow, the solder powder melts and wets to the copper or copper-alloy powder to form an intermetallic compound comprising copper. In some implementations, the solder powder comprises Sn or an Sn alloy, and a lower melting phase of the Sn or Sn alloy remains in the solder composite after reflow, where the intermetallic compound is a CuSn intermetallic compound.

In some implementations, reflow soldering the assembly comprises reflow soldering the assembly at a peak temperature of 250° C. or less.

In some implementations, the method further comprises: after forming the solder composite, reflow soldering the assembly a second time at or above a melting temperature of the solder powder, where the intermetallic compound is configured to prevent pump-out of solder from the solder composite when reflow soldering the assembly the second time.

In some implementations, the flux is an epoxy flux, and applying the solder paste comprises applying the solder paste on a non-metallized surface of the heat generating device and a non-metallized surface of the heat transferring device.

In some implementations, during reflow, the epoxy flux cures after the solder powder melts and wets to the copper or copper-alloy powder to form the intermetallic compound.

In some implementations, the solder paste has a volume ratio of solder powder to high melting temperature particles between 5:1 and 2:1.

In some implementations, the heat generating device comprises a die, wherein the heat transferring device comprises a heat spreader. In some implementations, applying the solder paste comprises: dispensing the solder paste on the die; and placing the heat spreader housing on the solder paste to form the assembly. In some implementations, the flux is an epoxy flux, and dispensing the solder paste comprises dispensing the solder paste on a non-metallized surface of the die.

In one embodiment, an assembly comprises: a heat generating device; a heat transferring device; and a solder composite between surfaces of the heat generating device and heat transferring device, wherein the solder composite provides a thermal interface between the heat generating device and the heat transferring device, where the solder composite is formed by reflow soldering a solder paste comprising: a solder powder; particles having a higher melting temperature than a soldering temperature of the solder paste, wherein the solder paste has a volume ratio of solder powder to high melting temperature particles between 5:1 and 1:1.5; and flux. In some implementations, the solder powder comprises Sn or an Sn alloy, where the particles comprise a copper or copper-alloy powder, where the solder composite comprises a CuSn intermetallic compound.

In some implementations, a lower melting phase of the Sn or Sn alloy is in the solder composite, where the intermetallic compound is a CuSn intermetallic compound. In some implementations, the flux is an epoxy flux, and the solder composite is on a non-metallized surface of the heat generating device and a non-metallized surface of the heat transferring device.

In some implementations, the assembly is a chip carrier, the heat generating device comprises a die, and the heat transferring device comprises a heat spreader. In some implementations, the flux is an epoxy flux, and the solder composite is on non-metallized surfaces of the die and heat spreader.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The technology disclosed herein, in accordance with one or more various embodiments, is described in detail with reference to the included figures. The figures are provided for purposes of illustration only and merely depict example implementations. Furthermore, it should be noted that for clarity and ease of illustration, the elements in the figures have not necessarily been drawn to scale.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

Thermal Via Filling

Some conventional solder paste compositions may not serve as a good thermal via filling material because of their composition. They contain about 50% by volume of flux and about 50% by volume solder powder. However, during a conventional solder paste reflow soldering process, the flux component of the paste may be expelled from the metal power component, leaving about 50% of the original paste volume. Accordingly, if a via is filled with conventional solder paste, the solder joint formed after reflow may only fill a portion (e.g., about 50%) of the length of the via hole (i.e., the depth of the substrate). As the solder joint does not reach both surfaces of the PCB substrate, the solder joint filled thermal via may not transfer heat efficiently.

In view of the foregoing, it would be desirable to use a solder paste for thermal via filling such that, during reflow, the solder paste deposited into the thermal via does not reduce in volume, thereby forming a solder joint that reaches both surfaces of the PCB substrate. Additionally, it would be desirable to use a solder paste that forms a solder joint that exhibits a much higher melting temperature than the original reflow temperature such that the filled thermal via may maintain its physical shape during subsequent PCB board assembly processes.

To this end, various implementations of the disclosure are directed to a thermal via filling solder paste that exhibits little to no volume loss during reflow soldering. In accordance with various implementations of the disclosure, the solder paste includes a solder powder such as tin-silver-copper (SAC), a high melting temperature metallic powder (e.g., a Cu powder) having a higher melting temperature than the solder powder, and flux. The high melting temperature metallic powder may be configured to have a melting temperature significantly higher than the solder powder but still wet with the solder powder at reflow soldering temperatures. By virtue of this configuration, after a thermal via is filled with the solder paste, during reflow, the solder powder may melt and wet to the high melting temperature metallic powder, forming intermetallic compounds that keep the via holes filled during and after reflow soldering.

Figure 1:
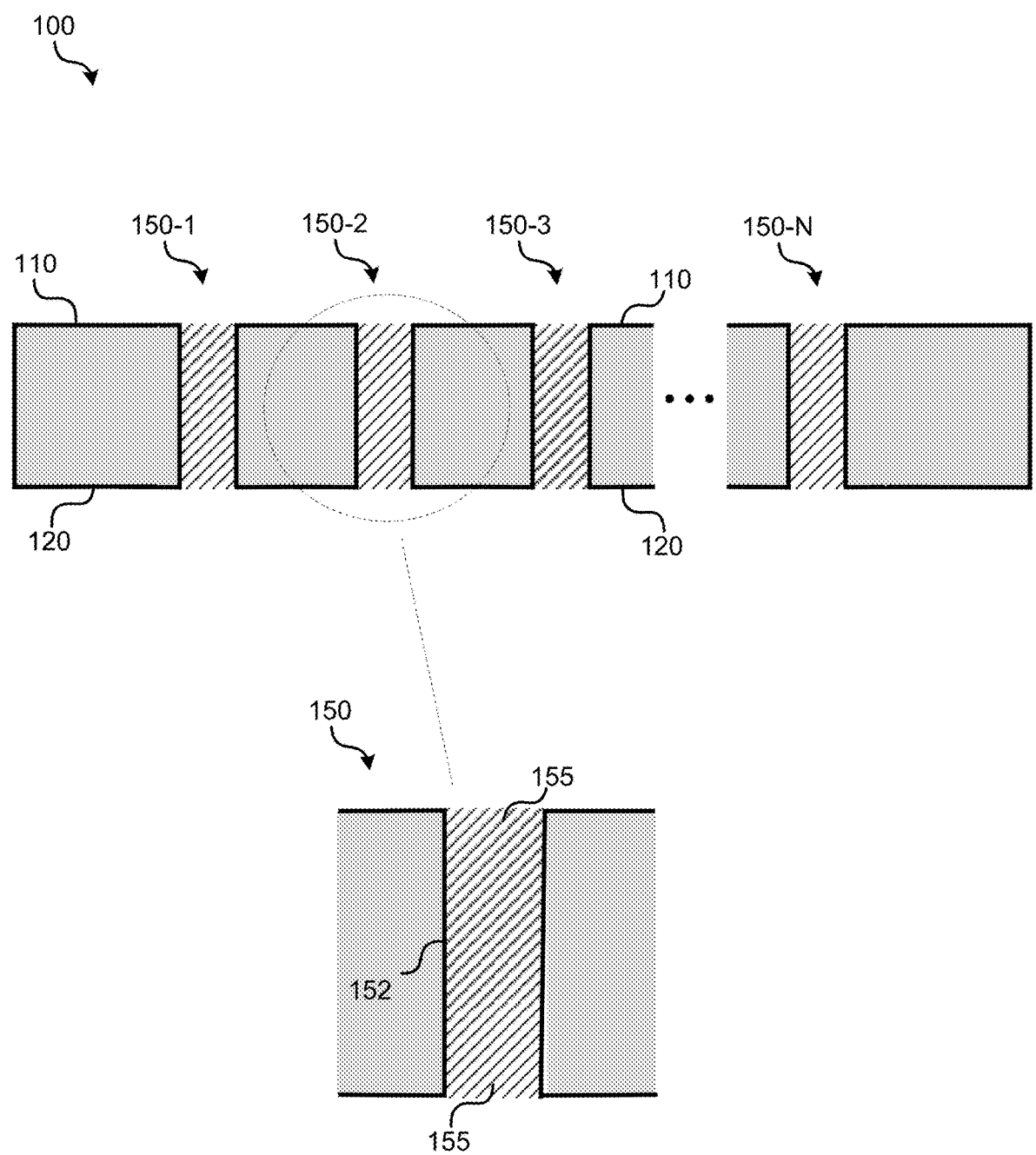
FIG. 1 depicts a simplified example of a PCB substrate with solder-paste filled vias, in accordance with implementations of the disclosure.

FIG. 1 depicts a simplified example of a PCB substrate 100 with solder-paste filled vias, in accordance with implementations of the disclosure. PCB substrate 100 may be made of a non-conducting material such as FR-4 which is made from woven fiberglass cloth impregnated with an epoxy resin. PCB substrate 100 may include various layers of conductive wires or traces through which electric current may flow to couple electronic components. In the illustrated example, PCB substrate 100 includes a top surface layer 110 and bottom surface layer 120. A plurality of solder-paste filled vias 150-1, 150-2, 150-3, . . . , 150-N (collectively referred to as "vias 150" and individually referred to as a "via 150") form through holes that electrically connect top surface layer 110 to bottom surface layer 120. A via 150 may include a barrel plated with copper or some other conductive material 152, anti-pads (not shown) to provide clearance between the via and metal layer to which it is not connect, and pads to connect each end of the barrel to a component, plane or trace. Depending on the implementations, vias 150 may be via-in-pad plated over (VIPPO) structures, non-VIPPO structures, or a combination of the two types of structures.

Although filled through hole vias exposed on both sides of the PCB substrate 100 are illustrated in this example, it should be appreciated that in some implementations PCB substrate 100 may include a combination of through holes, blind holes, buried holes, or other some other type of via that provides electrical connection between internal and/or external layers of the PCB substrate. These other types of vias, in some implementations, may also be filled with the solder paste described herein. As such, in addition to top layer 110 and bottom layer 120, it should be appreciated that PCB substrate 100 may include one or more internal layers that are electrically connected using vias, pads, traces, or other components running along or through the surface of the different layers of the PCB substrate.

As illustrated, each via 150 is filled with a solder paste 155. Solder paste 155 comprises a solder powder, high melting temperature particles having a higher melting temperature than the solder powder, and flux. Solder paste 155 may form into a solder joint during a reflow process.

The solder powder may comprise a solder metal or alloy having a melting temperature such that it melts during typical reflow soldering temperatures. For example, the solder powder may be composed of a solder metal or alloy have a liquidus or melting temperature in the range of 90-450° C. In some implementations, the solder metal or alloy may be composed of bismuth (Bi), a Bi-alloy (e.g., Bi—Ag alloy, Bi—Cu alloy, Bi—Ag—Cu alloy, Bi—Sn alloy, or Bi—In alloy), tin (Sn), an Sn-alloy (e.g., an Sn—Ag alloy, Sn—Cu alloy, Sn—Ag—Cu alloy, or Sn—In alloy), indium (In), an In-alloy, or some other suitable solder alloy.

The high melting temperature particles may be wettable by the solder of the solder powder and have a melting temperature significantly higher than that of the solder powder. In particular, they may have a melting temperature greater than a soldering temperature of the solder paste. For example, the high melting temperature particles may have a melting temperature of greater than 500° C. The higher melting temperature particles may help to maintain the thermal, electrical, and/or mechanical integrity of a formed solder joint (e.g., joint formed in via) without collapse, even after subsequent exposure of the joint to the original curing/melting temperatures, or even higher temperatures.

In some implementations, the high melting temperature particles may be composed of Cu or a Cu alloy, Ni or a Ni alloy, or some combination thereof. The high melting temperature particles may be implemented in a powder form. For example, the high melting temperature particles may be implemented as a copper powder having a melting temperature of about 1085° C.

In some implementations, high melting temperature particles may have diameters that vary in the range from a few nanometers to hundreds of microns, or some combination thereof.

In some implementations, the volume ratio between the solder powder and high melting temperature particles may be between 5:1 and 1:1.5. In some implementations, the volume ratio between the solder powder and high melting temperature particles is between 5:1 and 2:1. In particular implementations, the volume ratio is about 2:1.

In some implementations, the solder paste may comprise 15-60 vol % of the solder powder, 8-36 vol % of the high melting temperature particles, and 40-60 vol % of the flux.

As noted above, the high melting temperature particles may be wettable by the solder during reflow temperatures. For example, when a thermal via is filled with a solder paste in accordance with implementations of the disclosure, and reflowed at a peak temperature of about 240-250° C., the solder powder may melt and wet to a solid powder of the high melting temperature particles to form a layer of intermetallic compound. For example, the solder powder may wet to a solid copper powder and form a layer of intermetallic compound.

With a high enough Cu powder concentration, the Cu powder may be bonded to the solder powder with an intermetallic compound bridge and form a Cu powder network. Because intermetallic compounds such as $Cu_6Sn_5$ typically exhibit a high melting temperature (e.g., 450° C. or higher), a copper powder network impregnated in liquid solder may form a rigid solder plug that prevents the collapse of the whole solder body during reflow. As such, by virtue of this implementation, a thermal via may be fully filled with the solder paste before and after a reflow process. The solder column, owing to the high thermal conductivity of the solder powder and copper metal, may provide a significantly reduced thermal resistance when compared to the substrate itself.

Furthermore, due to the formed copper powder network, the solid column may not collapse when reheated to a temperature above the melting temperature of the solder powder, such as 240-250° C. In implementations, this effect may best be achieved when the volume ratio of the solder powder to copper powder is between 5:1 and 1:1.5. If too much solder is used, the copper may not be enough to form a Cu-powder-network to keep the solder from collapsing. On the other hand, if too much copper powder is used, there may be insufficient solder to form an intermetallic compound bridge to bond all Cu-powder into a network, resulting in loose copper powder that may be entrapped in the solder joint, resulting in a weak solder joint.

The flux of the solder paste 155 may be a "no-clean" flux where the flux remains in the solder joint such as the one contained in Indium8.9HF or Indium10.1HF, a low residue flux, such as NC-SMQ75, or a polymer-based flux such as an epoxy flux.

In implementations of a polymeric flux, the flux may be a thermal or photonic-curable polymeric flux. The flux may contain a polymeric material with attached acid groups for fluxing. The fluxing acid groups may incorporate into the polymeric chain during polymeric curing, leaving no remaining acid groups that could contribute to corrosion during the lifetime of the solder joint. This may be in contrast to traditional solder pastes that may cause corrosion from the remaining acid groups after curing, which may be undesirable because the formation of metal oxides may weaken the solder joint over time, and damage thermal and electrical pathways.

Polymeric fluxing materials may also provide better bonding to the substrate (e.g., side walls of via) as compared to traditional fluxes. For example, traditional and low residue fluxes may leave some low molecular weight materials in contact with the substrate, which may decrease the overall integrity of a solder joint. In the case of a through-hole via on a PCB, a polymeric flux may bond to the substrate (e.g., alternating layers of glass fiber and polymer resin contained in a typical PCB), improving overall joint integrity.

Additionally, the use of a metal-containing epoxy flux may obviate the need to a plate a through-hole via with copper, which could potentially save time and money during manufacture of PCBs.

In some implementations, the flux may contain 100% curable components that do not lose mass or reduce in volume, forming a rigid solid shape after curing. In such implementations, the formation of cavities due to the loss volatiles may be minimized or eliminated, and a high thermal conductivity may be assured. A cured epoxy flux and high melting temperature particles (e.g., Cu) may contribute to the integrity of the formed solder joint, preventing both collapse of the joint and the formation of gaps at the top or bottom of the solder joint (e.g., in the case of a filled via). The cured polymer may fill voids between the solder and the high melting temperature particles to prevent collapse.

In various implementations, the solder alloy of the solder paste may be configured to melt at a lower temperature than the epoxy flux cures. In such implementations, the solder alloy and high melting temperature particles (e.g., Cu) may fuse together and form an intermetallic compound with the base metal (e.g., in the case of a metallic substrate) prior to the epoxy flux curing. For instance, a low-melting temperature solder alloy such as Bi—Sn may be utilized in such implementations.

Although some implementations of the solder paste described herein have been primarily described in the context of filling thermal vias of PCB substrate, it should be appreciated that the solder paste described herein may suitable for other applications. For instance, a solder paste in accordance with the disclosure may be utilized to bridge several pads on a PCB such as a common ground or continuous racetrack formation without shrinkage of the paste. The rigid shape may be formed after curing with minimal or no electrical, thermal, and/or mechanical gaps in the trace. More generally, the solder paste described herein may be used as an alternative to conventional solder pastes to provide an electrical and/or thermal conductor (e.g., for a through-hole via on a PCB) without the gaps sometimes seen in conventional solder pastes that contain volatile components that reduce the mass and volume of the joint.

Figure 2:
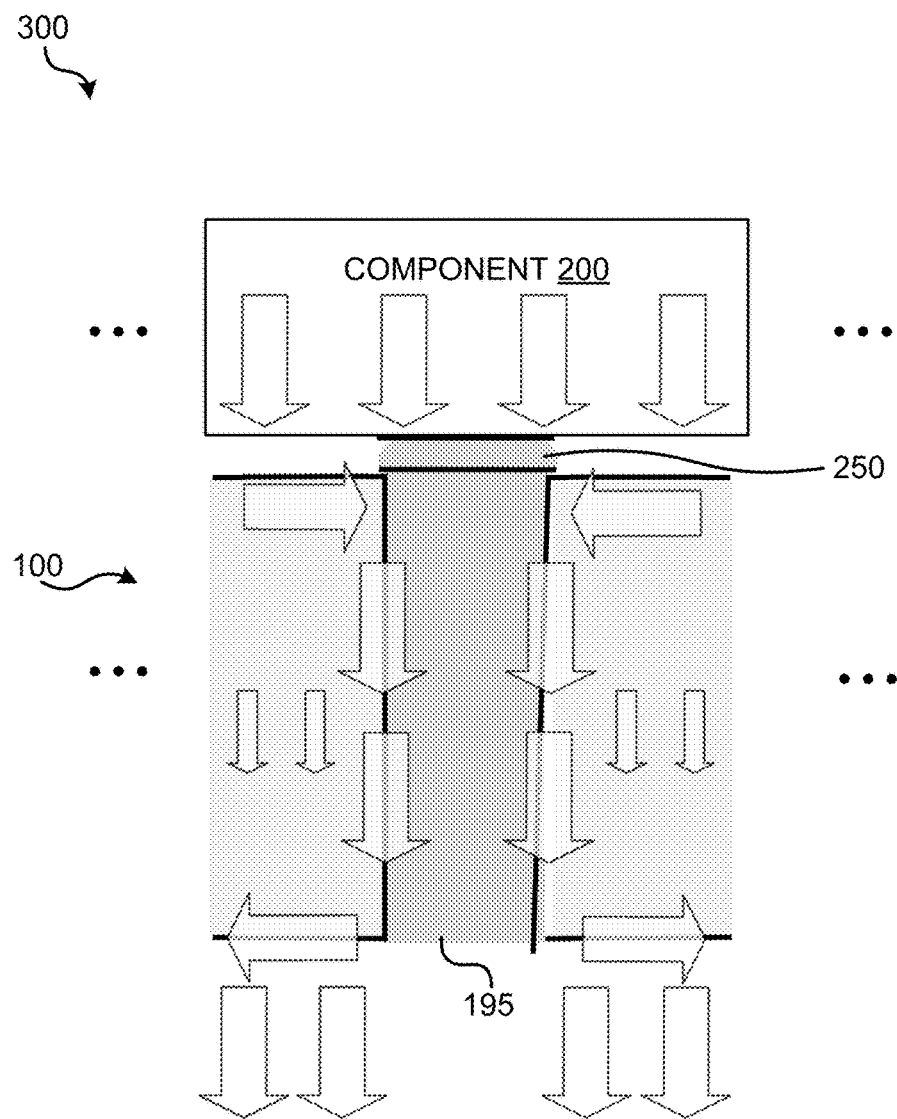
FIG. 2 illustrates a PCB assembly, in accordance with implementations of the disclosure.

FIG. 2 illustrates a PCB assembly 300 in accordance with implementations of the disclosure. As illustrated, PCB assembly 300 includes a component 200 bonded to a PCB substrate 100 at joint 250. (e.g., a solder joint). PCB substrate includes a via filled with a solder joint 195 (e.g., formed after reflowing a solder paste in accordance with the disclosure). The arrows of FIG. 2 illustrate the heat flow from component 200 and through PCB substrate 100. As shown in this example, heat is generated uniformly on the surface of component 200 and intercepted by a thermally conductive surface of PCB substrate 100. Because of the high thermal conductivity of the metal (e.g., copper) plating the surface area near the via, most of the heat may converge to the via location. Additionally, because of the high thermal conductivity of solder joint 195 relative to the other material of PCB substrate 100, most of the heat will flow along the length of the thermally conductive via and diverge upon reaching the bottom plane of the substrate.

In embodiments, component 200 may include active electronic devices (e.g., BGA packages, chip scale packages, and Flip Chip packages); passive electronic devices (e.g., resistors, capacitors, and light emitting diodes); and non-electronic parts (e.g., electrical connectors, battery clips, heat sinks, and relays). Although the example of FIG. 2 illustrates a component 200 connected to a via-in-pad (VIPPO) pad of a via of PCB substrate 100, it should be appreciated that component 200 may be connected to PCB substrate 100 using non-VIPPO pads or a combination of VIPPO and non-VIPPO pads.

Figure 3:
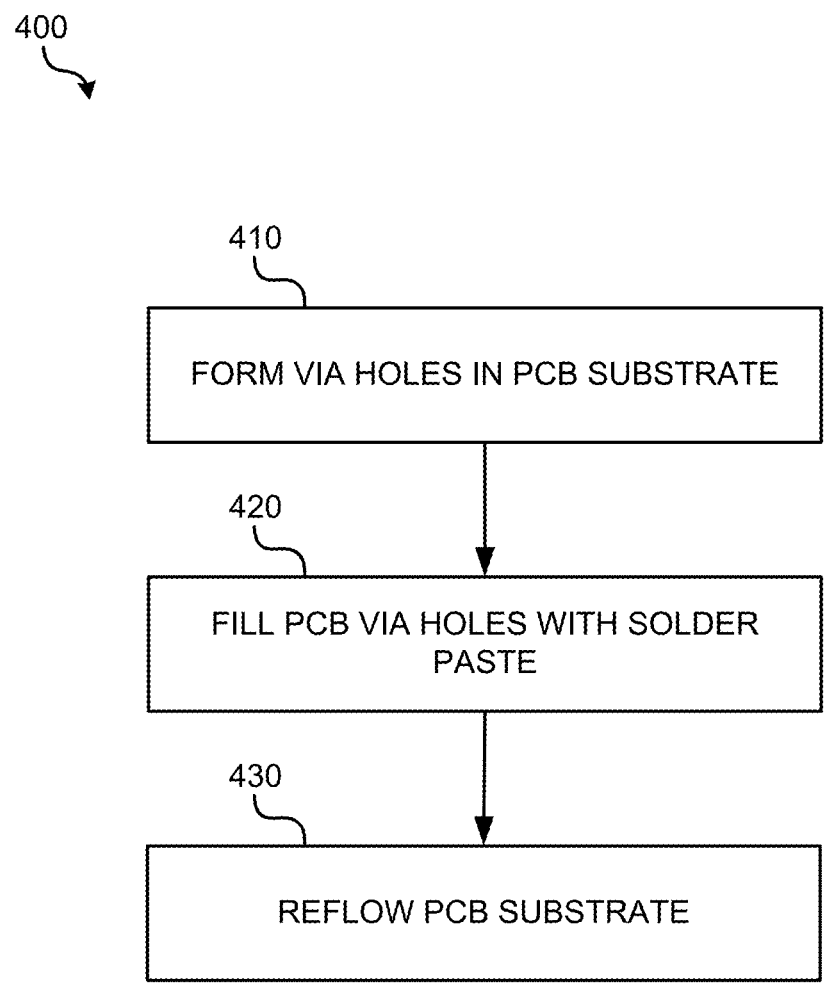
FIG. 3 is an operational flow diagram illustrating example steps of a method of forming a PCB substrate, in accordance with implementations of the disclosure.

FIG. 3 is an operational flow diagram illustrating example steps of a method 400 of forming a PCB substrate, in accordance with implementations of the disclosure. For simplicity of discussion, some steps may be omitted. At operation 410, via holes are formed in a PCB substrate. For example, via holes may be drilled into the PCB substrate. The via holes may be formed in any suitable pattern or array to provide electrical connections between layers of the PCB substrate, and/or to provide a thermal path for heat flow.

At operation 420, the formed PCB via holes are filled with a solder paste comprising a solder powder, high melting temperature particles having a higher melting temperature than the solder powder, and flux. The via holes may be filled by printing or some other suitable deposition method. The solder paste may be of the composition described herein with reference to various implementations. For example, the solder powder may comprise a SAC alloy or Bi alloy, the high melting temperature particles may comprise a copper powder, and the flux may comprise an epoxy flux.

At operation 430, after filling the PCB substrate via holes with the solder paste, the PCB substrate may be reflowed to form a solder joint in the filled via. The PCB substrate may be placed in a reflow oven, and reflowed at a suitable temperature profile. During reflow, the solder may melt and wet to the high melting temperature particles, forming intermetallic compounds that keep the via holes filled during and after reflow. In some implementations, the flux of the via may cure after the solder begins to melt and fuses with the high melting temperature particles (e.g., Cu) to form an intermetallic compound.

After formation of the solder joint, the PCB substrate may be bonded to components. The formed solder joints of the vias may maintain their integrity during subsequent reflow processes.

Thermal Interface Material

In addition to its utility as a thermal via filling material, the solder paste described herein may be particularly advantageous as a thermal interface material (TIM).

Although traditional solder preforms and pastes could potentially be used as TIMs because of their good thermal conductivity, they may be limited in requiring a solderable metallization surface. This requires plating substrate surfaces with solder surface finishes (e.g., NiAu, noble metals or noble metal alloys, etc.), which inevitably increases manufacturing cost and time. Additionally, traditional solder pastes may generate unacceptable flux fumes during reflow soldering and voids (e.g., as a result of outgassing within liquid solder joints) after reflow soldering. With solders being good thermal conductors, a solder preform-like material that maintains its shape while providing good surface contact between a thermal generating device (e.g., flip chip) and a thermal transfer device (e.g., heat spread housing), without requiring a solderable metallization surface, would be desirable. The solder paste described herein—including a solder powder; particles having a higher melting temperature than a soldering temperature of the solder paste, where the solder paste has a volume ratio of solder powder to high melting temperature particles between 5:1 and 1:1.5; and flux—may provide these and other technical advantages as a TIM.

In particular, the solder paste described herein may be reflow soldered at a lower temperature such that only the lower melting temperature solder powder reflows. For example, if the lower melting temperature solder powder is an SnAgCu solder with a melting temperature between 217° C. and 220° C., a reflow peak temperature between 240° C. and 250° C. may be sufficient for processing. Additionally, the solder paste described herein may maintain its shape during subsequent reflow processes, even at or above the original reflow temperature, such that there is no pump-out problem with the TIM. Moreover, the surfaces of the thermal generating device and thermal dissipating device may not require a solderable metallization surface (e.g., NiAu) in instances where the solder paste utilizes an epoxy flux that acts as an adhesive and becomes a thermoset resin after curing.

Figure 6:
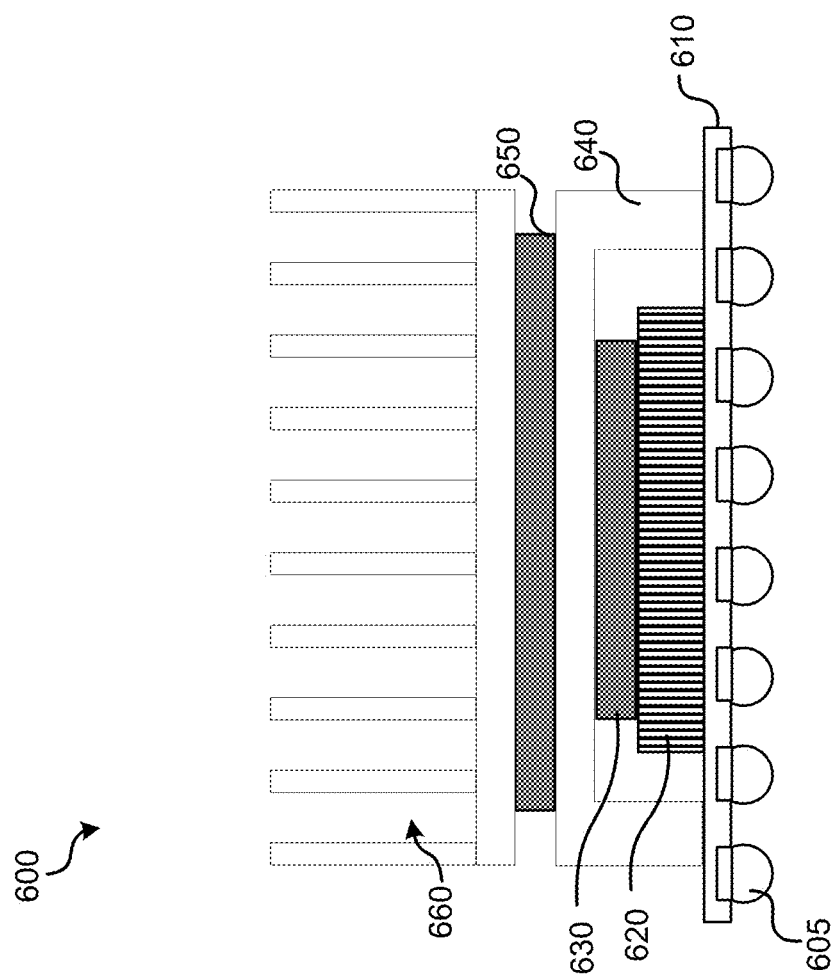
FIG. 6 depicts a cooling setup of a chip carrier, the cooling setup including a thermal interface material (TIM) in accordance with implementations of the disclosure.

FIG. 6 depicts a cooling setup of a chip carrier 600, the cooling setup including a TIM 630 in accordance with implementations of the disclosure. In this example, the chip carrier 600 is depicted as a ball grid array (BGA) assembly. However, it should be appreciated that the TIM 630 may be utilized to provide a TIM in other chip carriers or surface-mount packaging, including, for example, land grid arrays (LGA), pin grid arrays (PGA), and the like.

As illustrated, chip carrier 600 includes solder balls 605, a substrate 610, a die 620, a TIM 630, a heat spreader 640, a TIM 650, and a heatsink 660. Die 620 may be wire bonded to a top surface of substrate 610 by wire bonds (not shown) and overmolded with a molding compound (not shown) such as an epoxy-based plastic. Attached to a bottom side of substrate 610 is an array of solder balls 605. Each of the solder balls in this example is coupled to a respective pad that may couple to an interconnect (not shown) that electrically couples to die 620. In this manner, electrical signals may be conducted between the die 620 and a PCB onto which chip carrier 600 is placed.

Heat spreader 640 is configured to transfer energy as heat from die 620, via TIM 630, to heat sink 660, via TIM 650. TIM 630 is configured to provide high thermal conductivity and transfer heat generated by die 620 to heat spreader 640. TIM 630 may be a solder joint or composite formed by reflow soldering a solder paste as described in the present disclosure. TIM 650 is configured to transfer heat from heat spreader 640 to heat sink 660. In some implementations, TIM 650 may also be a solder joint or composite formed by reflow soldering a solder paste as described in the present disclosure.

Figure 7:
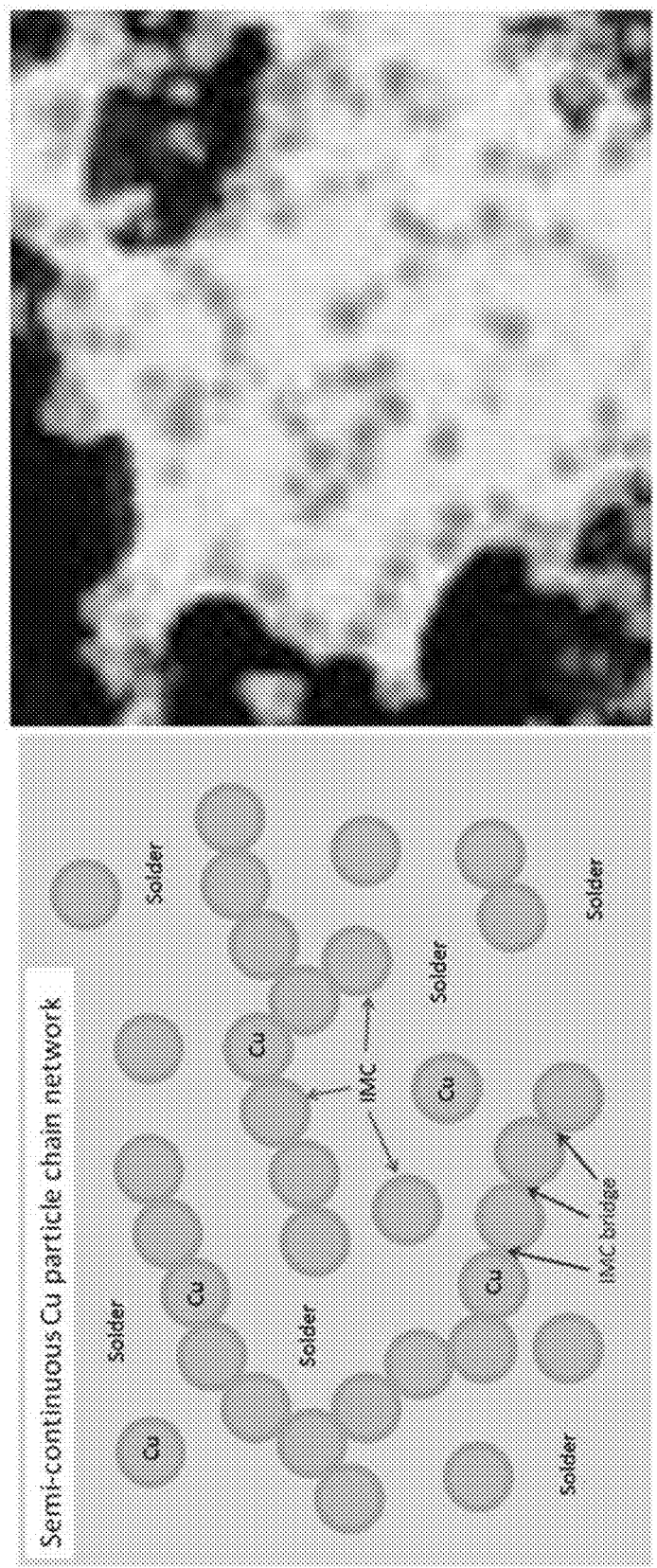
FIG. 7 depicts: i) on the left, a representation of a semi-continuous Cu particle chain network that may be formed after performing a first reflow soldering operation using a TIM in accordance with the disclosure; and ii) on the right, a cross-sectional view of an image of a reflowed Cu-filled solder paste in accordance with the disclosure.

Various advantages may be realized during and after assembly of chip carrier 600 by forming a TIM 630 by reflow soldering a solder paste as described herein. First, despite a coefficient of thermal expansion mismatch between die 620 and heat spreader 640, that would cause a conventional TIM to squeeze out the joint (i.e., pump-out), little to no pump out of the solder paste of TIM 630 occurs due to the presence of the higher melting temperature particles in the solder paste. In particular, as discussed above, by using a high enough Cu powder concentration as the higher melting temperature particles, the Cu powder may be bonded to the solder powder with an intermetallic compound bridge and form a network of CuSn IMC bridges to maintain the shape of the solder and prevent pump out. Because intermetallic compounds such as $Cu_6Sn_5$ typically exhibit a high melting temperature (e.g., 450° C. or higher), a copper powder network impregnated in liquid solder may form a rigid solder plug that prevents the collapse of the whole solder body during reflow. This is illustrated by FIG. 7, which shows: i) on the left, a representation of a semi-continuous Cu particle chain network that may be formed after performing a first reflow soldering operation to bond die 620 to heat spreader 640 via TIM 630; and ii) on the right, a cross-sectional view of an image of a reflowed Cu-filled solder paste in accordance with the disclosure. In order for the solder composite to not collapse when reheated to a temperature above the melting temperature of the solder during a subsequent reflow operation, the solder paste may have a volume ratio of solder powder to Cu particles (e.g., powder) between 5:1 and 1:1.5. If too much solder is used, the concentration of the Cu particle network may be too low to keep the solder (e.g., SnAgCu solder) from collapsing. On the other hand, if too many copper particles are used, all of the solder may be completely consumed.

Figure 8:
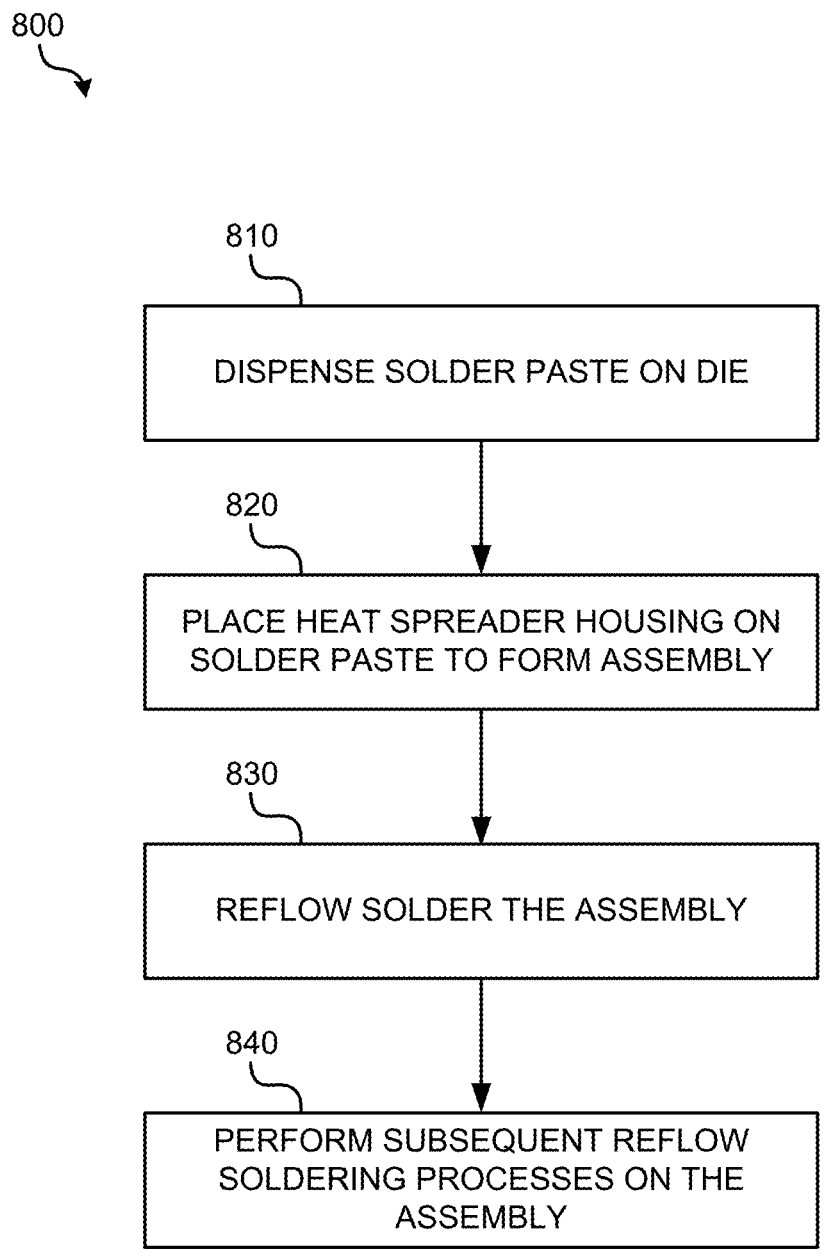
FIG. 8 is an operational flow diagram illustrating example steps of a method of forming components of a chip carrier, in accordance with implementations of the disclosure.

Second, by virtue of using the solder paste described herein to form TIM 630, there may be no need to have solderable metallization surfaces (e.g., noble metal coatings) on both die 620 and heat spreader 640. For example, the solder paste may be applied directly on a silicone surface of a silicone die. In such implementations, the solder paste described herein may utilize an epoxy flux that is curable during reflow soldering and promotes wetting of the solder powder, thereby obviating the need for metallized surfaces. Alternatively, in implementations where die 620 and heat spreader 640 have metallized surfaces, the solder paste of TIM 630 may utilize either an epoxy flux or regular flux. Third, in implementations where the solder paste utilizes a nonvolatile epoxy flux, voiding caused by outgassing from using traditional fluxes may be avoided FIG. 8 is an operational flow diagram illustrating example steps of a method 800 of forming components of a chip carrier, in accordance with implementations of the disclosure. At operation 810, a solder paste is dispensed on a die, the solder paste including: a solder powder; particles having a higher melting temperature than a soldering temperature of the solder paste, where the solder paste has a volume ratio of solder powder to high melting temperature particles between 5:1 and 1:1.5; and flux. In some implementations, the high melting temperature particles are copper particles, nickel particles, silver particles, or gold particles. In some implementations, the solder powder includes an Sn alloy such as an SnAgCu powder (e.g., Sn96.5/Ag3.0/Cu0.5 (SAC305) powder) or SnPb powder. In some implementations, the solder alloy may be a BiSnAg alloy. In some implementations, the flux is an epoxy flux that promotes wetting of the solder powder during reflow soldering, and obviates the need for metallized surface finishes on the chip carrier or a heat spreader housing. In some implementations the volume ratio of the solder alloy and the flux is about 1:1.

At operation 820, a heat spreader housing is placed on the solder paste to form an assembly. At operation 830, the assembly is reflow soldered to form a solder joint or composite from the solder paste between the die and heat spreader. In some implementations, the assembly is reflow soldered at a peak temperature between 240° C. and 250° C. During reflow soldering, the solder powder may melt and wet to the high melting temperature particles (e.g., solid copper powder) to form a layer of intermetallic compound. With an appropriate concentration of Cu powder particles (17-60% by volume of total metal), a continuous or semi-continuous Cu particle chain network as described above with reference to FIG. 7 may be formed. As discussed above, because intermetallic compounds, such as Cu6Sn5, typically exhibit a melting temperature of 450° C. or higher, the continuous or semi-continuous Cu particle chain network in liquid solder may prevent the collapse of the solder composite when reheated to a reflow soldering temperature. In this manner, the solder composite can survive subsequent surface mount technology reflows without deformation.

In various implementations, after reflow soldering, a low melting temperature phase of the solder remains in the solder composite. This low melting temperature phase may remain even after subsequent reflow soldering processes, discussed below.

At operation 840, subsequent reflow soldering processes may be performed on the assembly to add additional components to the assembly. The presence of the Cu particle chain network may permit the solder joint to maintain its shape and prevent collapse or pump-out during subsequent reflow processes, even at peak reflow temperatures that are at or above the melting temperature of the solder powder. The capability of performing a second reflow or even more than two reflows using the instant TIM is an advantage that may be realized as compared to traditional thermal greases.

In implementations where a Sn solder alloy is utilized as the solder powder, improved compliance of the solder composite TIM to the surfaces of the die and spreader may be realized by virtue of the softness of tin. For example, Sn96.5/Ag3.5 has a much lower young's modulus (about 50 Gpa at room temperature) than that of a CuSn intermetallic compound (normally on the order of 110 to 150 Gpa). This may make the TIM solder composite less brittle to stress (e.g., improve shear strength).

EXPERIMENTAL RESULTS

Example 1: Solder Paste Using a No-Clean Flux

Figure 4:
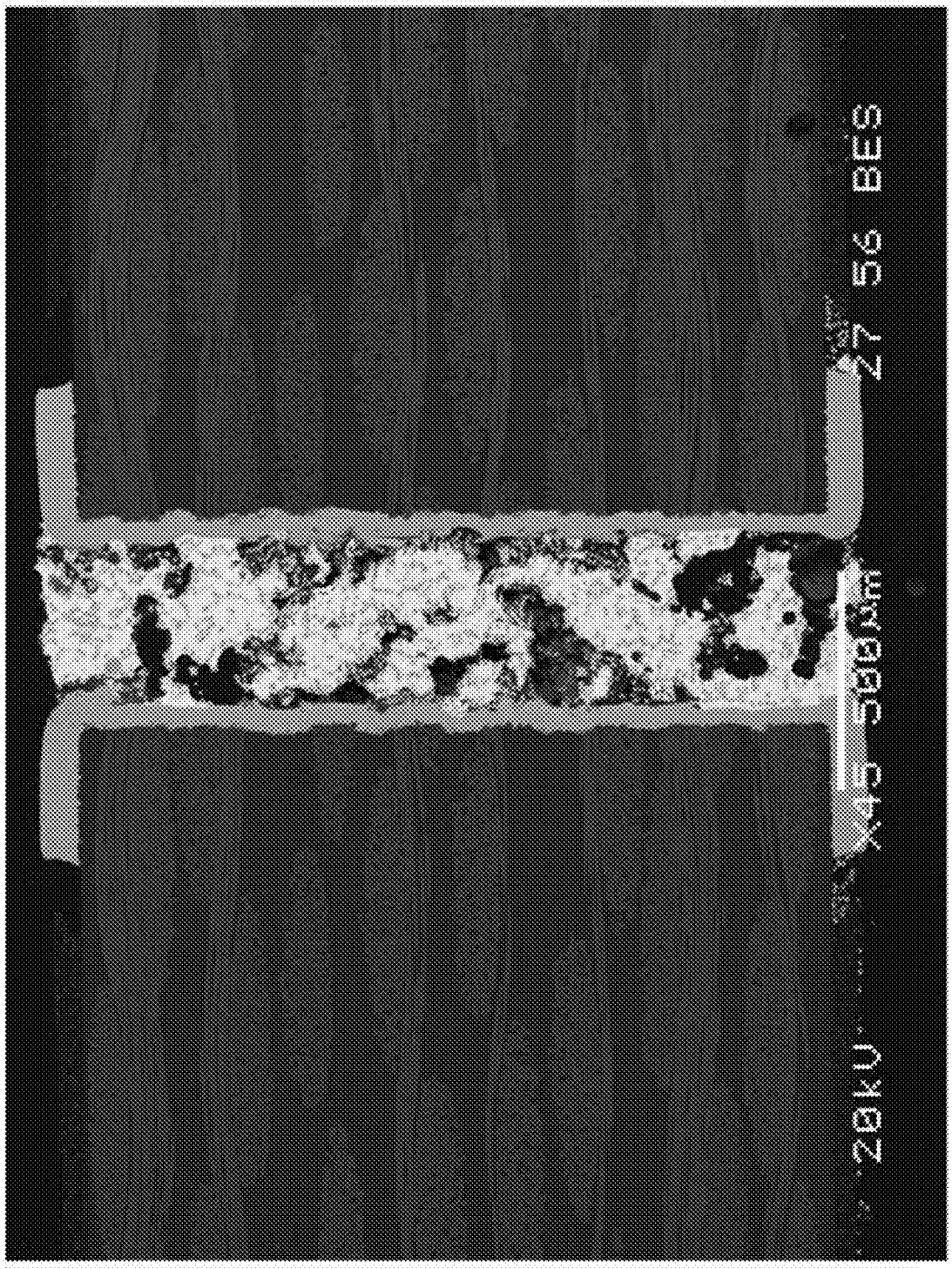
FIG. 4 is a micrograph illustrating a cross section of a PCB via hole after reflow with a solder paste, in accordance with implementations of the disclosure.

In one example, a solder paste was made by mixing 12 g Indium8.9HF flux, 58 g Sn96.5/Ag3.0/Cu0.5 (SAC305) powder, and 30 g copper powder. The volume ratio of SAC305 to copper powder was approximately 2:1. The paste was used to fill, by printing, a through-hole via of a PCB having a diameter of 14 mil. After the through-hole via was filled, the PCB was placed in a convection reflow oven with a time-temperature profile typically used to reflow SAC305 solder paste. FIG. 4 is a micrograph illustrating a cross section of the PCB via hole after reflow with the solder paste. As illustrated, the via hole is filled from top to bottom, and the solder joint body is semi-continuous. The semi-continuous solder body provided an effective thermal-conductive metal conducting path.

The same solder paste of example 1 was reflowed and then grounded to a thin-disk shape. The thermal conductivity of the solder joint was measured by a NanoFlash® instrument, which resulted in a thermal conductivity readout of 4.0 $Wm^{-1}K^{-1}$ at 25° C. By comparison, a conventional FR-4 substrate has an approximate thermal conductivity of 0.1 $Wm^{-1}K^{-1}$. As such, the solder paste may provide a significant reduction in thermal resistance when used to fill thermal vias of a PCB substrate.

When the aforementioned disk was reheated to 260° C., no collapse was observed. As such, a PCB substrate with such paste-filled thermal vias may survive the subsequent surface mount technology processing.

Example 2: Solder Paste Using Epoxy Flux

Figure 5:
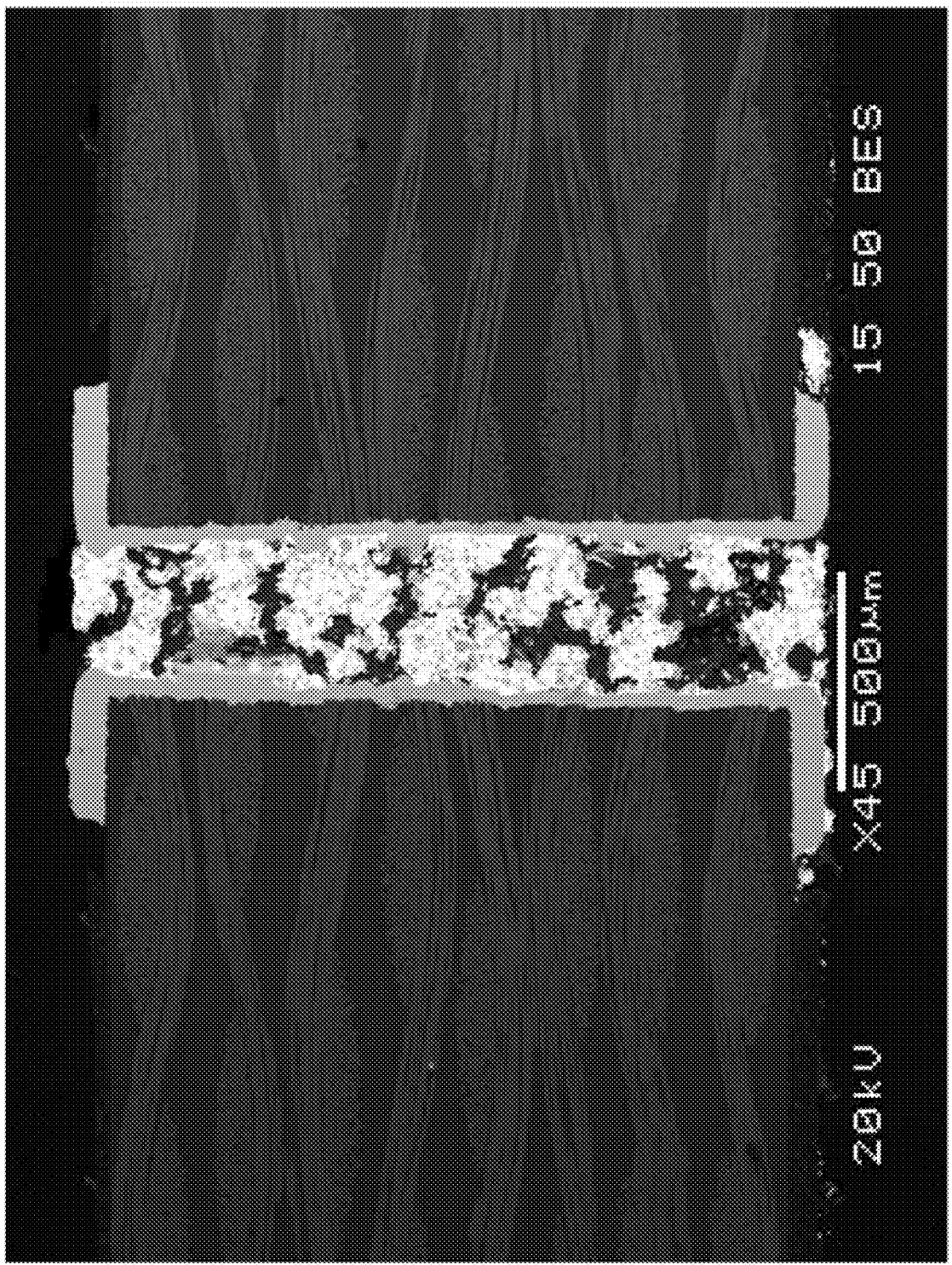
FIG. 5 is a micrograph illustrating a cross section of a PCB via hole after reflow with a solder paste, in accordance with implementations of the disclosure.

In one example, a solder paste was made by mixing 12 g epoxy flux, 58 g SAC305 powder, and 30 g copper powder. The volume ratio of SAC305 to copper powder was approximately 2:1. The paste was used to fill, by printing, a through-hole via of a PCB having a diameter of 14 mil. After the through-hole via was filled, the PCB was placed in a convection reflow oven with a time-temperature profile typically used to reflow SAC305 solder paste. FIG. 5 is a micrograph illustrating a cross section of the PCB via hole after reflow with the solder paste. As illustrated, the via hole is filled from top to bottom, and the solder joint body is semi-continuous. The semi-continuous solder body provided an effective thermal-conductive metal conducting path. In this example, by using a cured epoxy flux, fewer cavities were formed in the solder joint body. The thermal conductivity of the solder joint was measured at 8.6 $Wm^{-1}K^{-1}$ at 25° C., indicating a higher thermal conducting efficiency than the previous example.

Example 3: Additional Solder Pastes Using Epoxy Fluxes

In another example, three solder paste samples were made by mixing a SAC305 Type 4 powder, a Cu powder having spheroidal particles with a particle size of 10-25 microns, and Indium's 756-72 epoxy flux. The compositions and concentrations of the three samples (EP1, EP2, and EP3) are stated in Table 1, below.

TABLE 1

| Sample | EP1 | EP2 | EP3 |
| --- | --- | --- | --- |
| SAC305/Cu Volume ratio | 5/1 | 2/1 | 1/1.5 |
| Cu volume % of metal | 17 | 33 | 60 |
| 756-72 epoxy flux (g) | 7.2 | 7.2 | 7.2 |
| SAC305 Type 4 (g) | 42.5 | 32.9 | 18.7 |
| Cu (10-25u) (g) | 10.3 | 19.9 | 34.1 |
| Total (g) | 60 | 60 | 60 |

Figure 9:
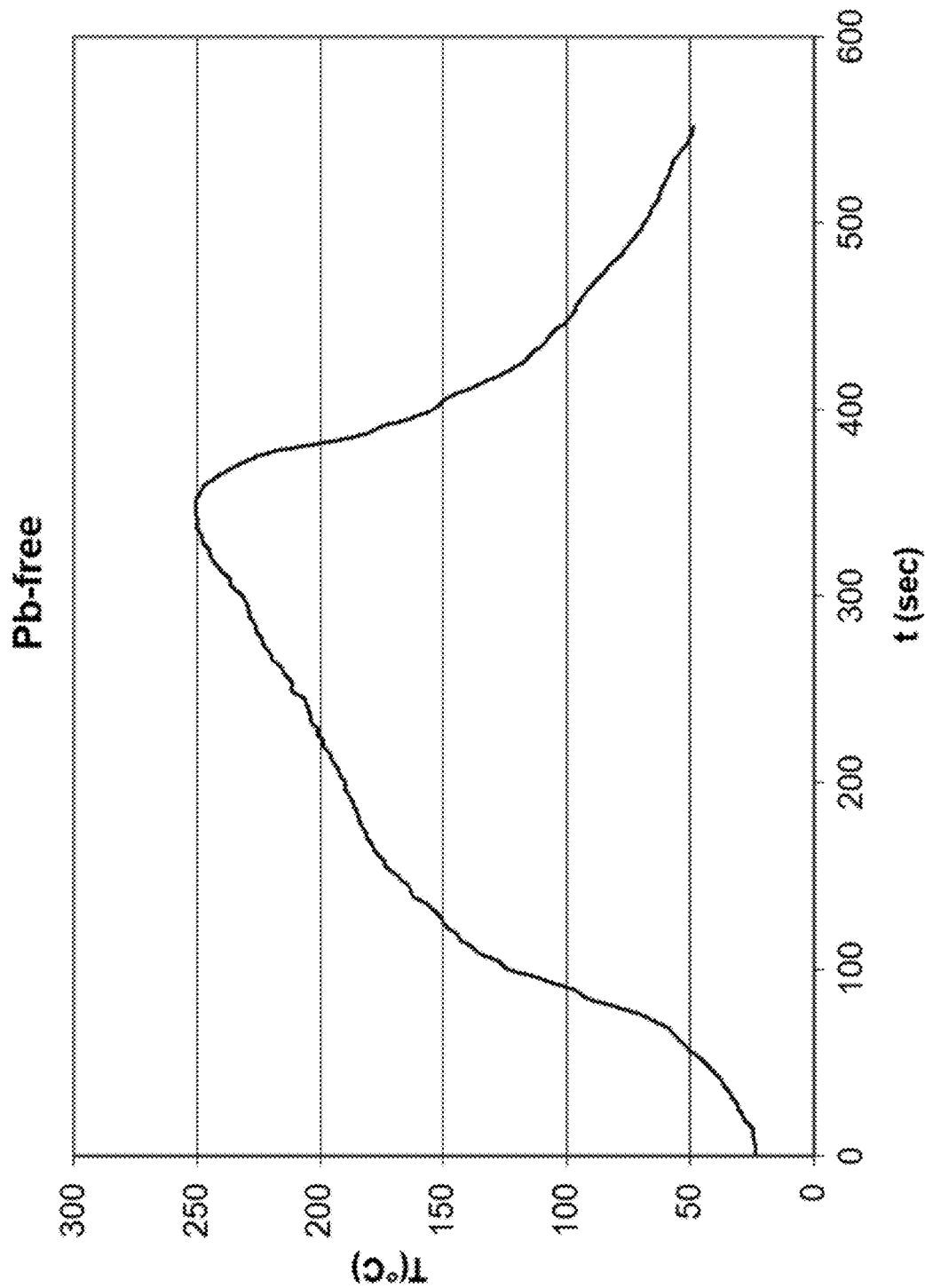
FIG. 9 depicts a time-temperature profile of a reflow soldering operation.

Each of solder pastes EP1, EP2, and EP3 was dispensed into a 28 mm diameter aluminum dish, then reflow soldered using a BTU VIP-70 convection oven running a time-temperature profile with a peak temperature of 250° C. and with nitrogen atmosphere. The time-temperature profile is depicted by FIG. 9.

Figure 10:
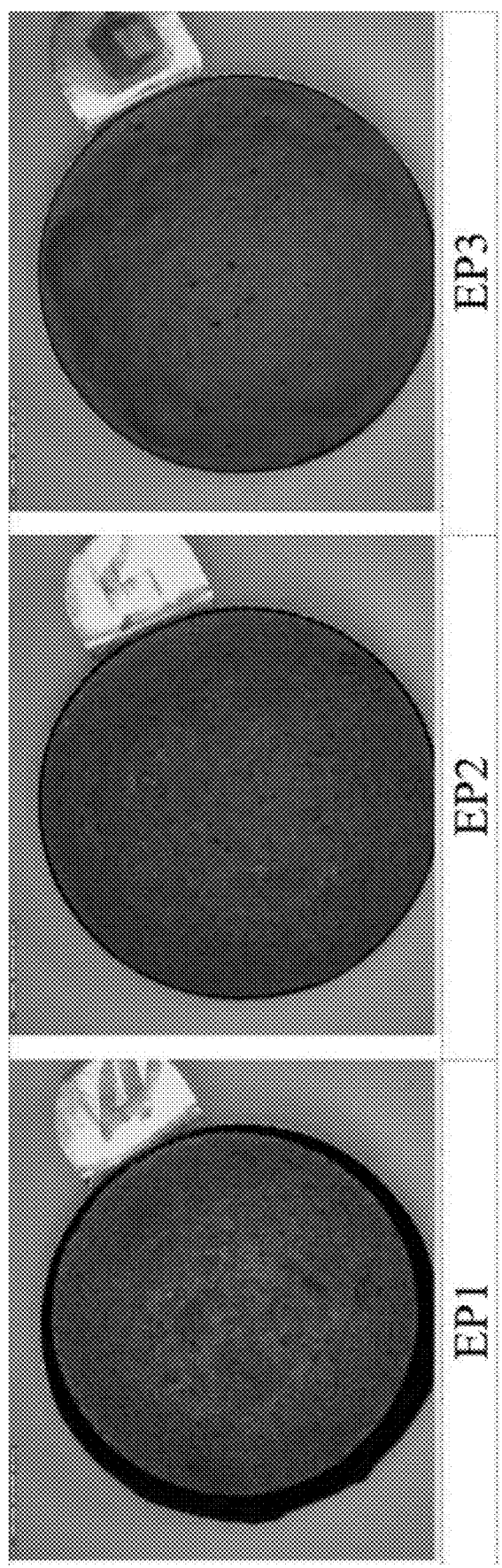
FIG. 10 illustrates three different samples of a solder composite in accordance with the disclosure, after a first reflow operation.

FIG. 10 illustrates the three samples after the first reflow operation. After cooling down to room temperature, the solder composite formed from EP1 exhibited a very slight volume reduction when compared to the volume of the original solder paste. EP2 and EP3 did not exhibit a volume reduction.

Figure 11:
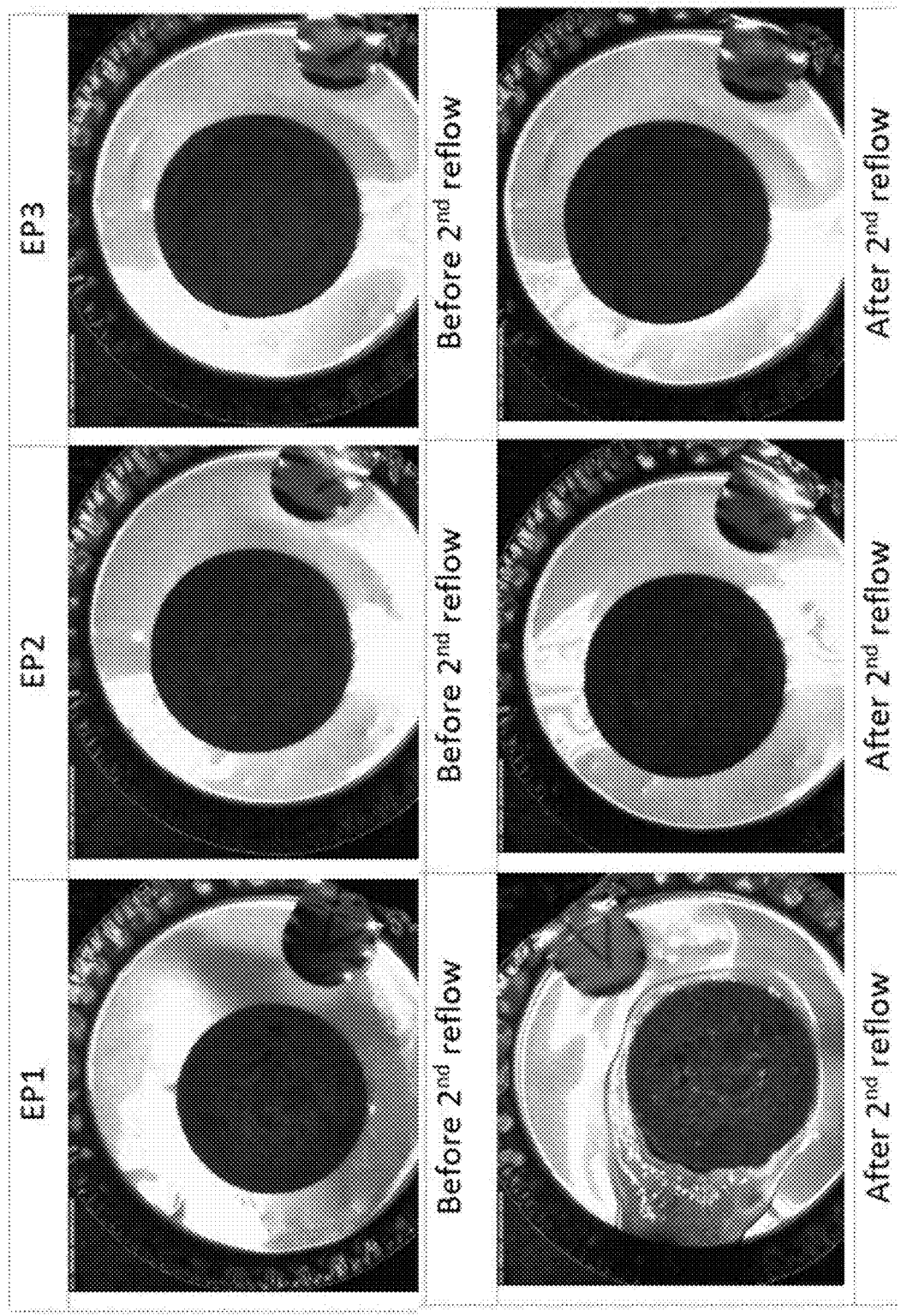
FIG. 11 illustrates the three samples of FIG. 10 after a second reflow operation.

After the first reflow operation, the disk-shaped solder composites were transferred to bigger trays, and placed in the BTU oven for a second reflow under the same conditions. FIG. 11 illustrates the three samples after the second reflow operation. As shown, all three composites did not re-melt, and their sizes and shapes did not change. EP1 had a small amount of flux squeeze out (pump-out). EP2 and EP3 did not exhibit any pump-out.

Figure 12:
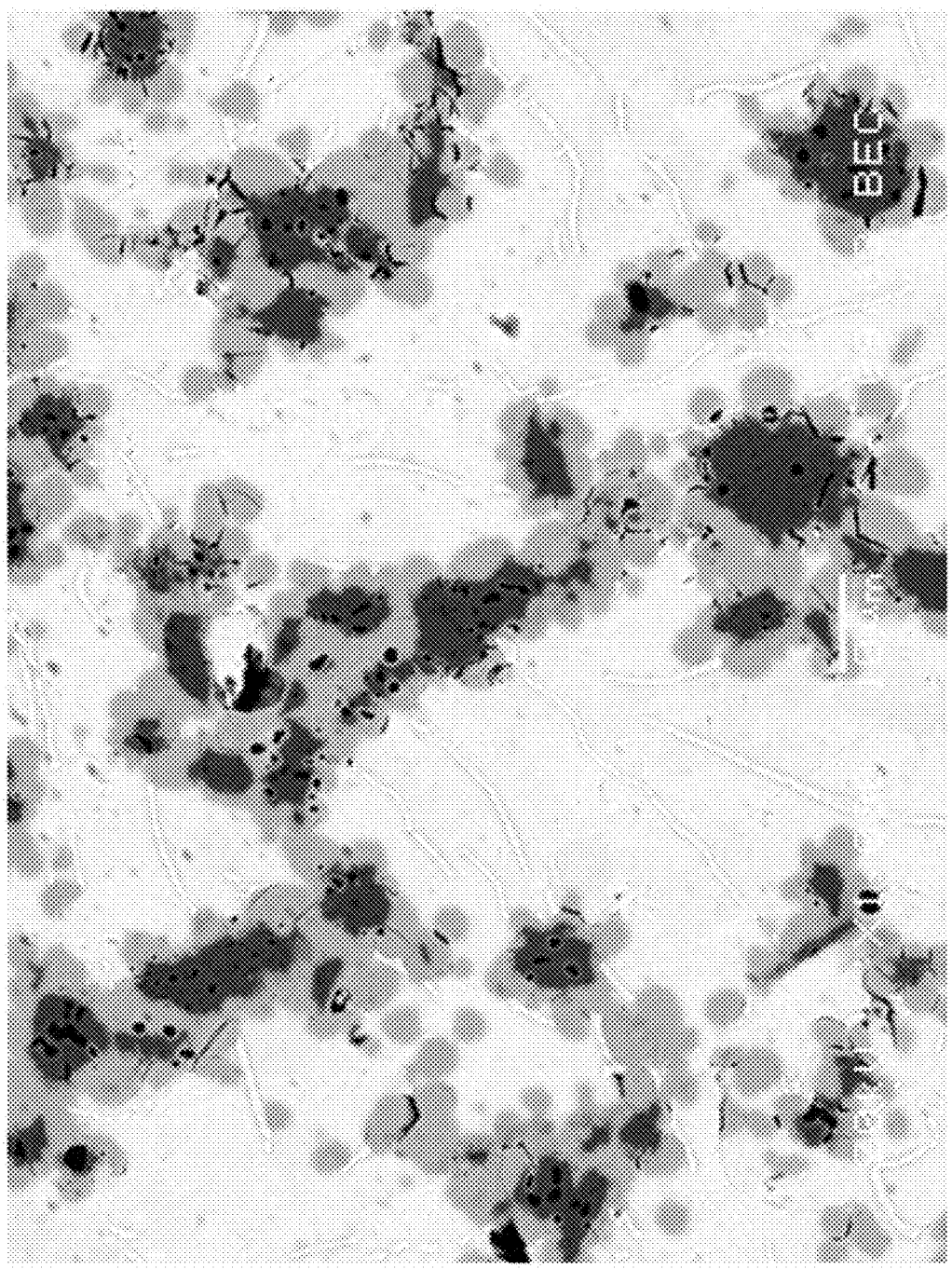
FIG. 12 shows a scanning electron microscope (SEM) image of a cross section of a solder paste, in accordance with the disclosure, after reflow.
Figure 13:
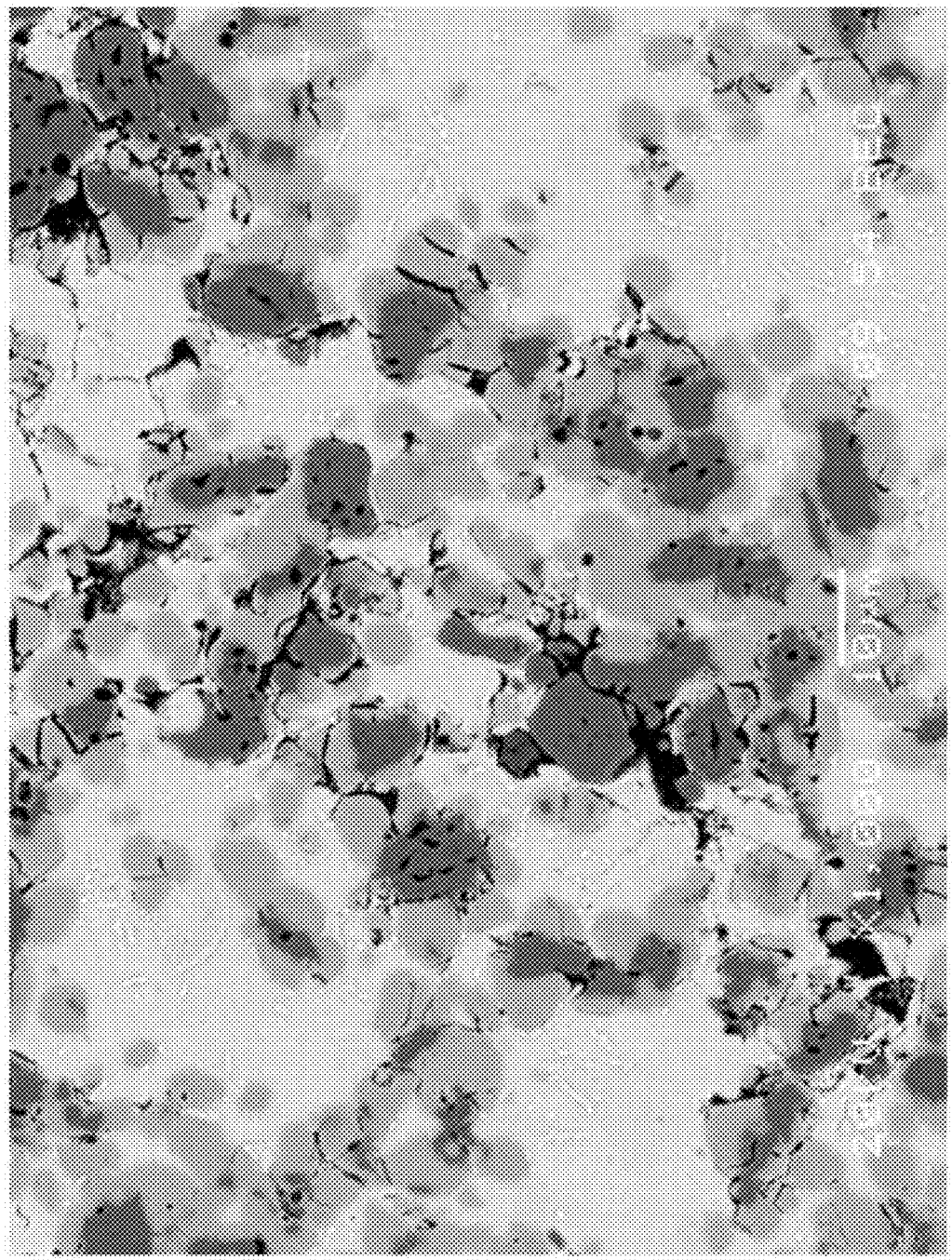
FIG. 13 shows an SEM image of a cross section of a solder paste, in accordance with the disclosure, after reflow.
Figure 14:
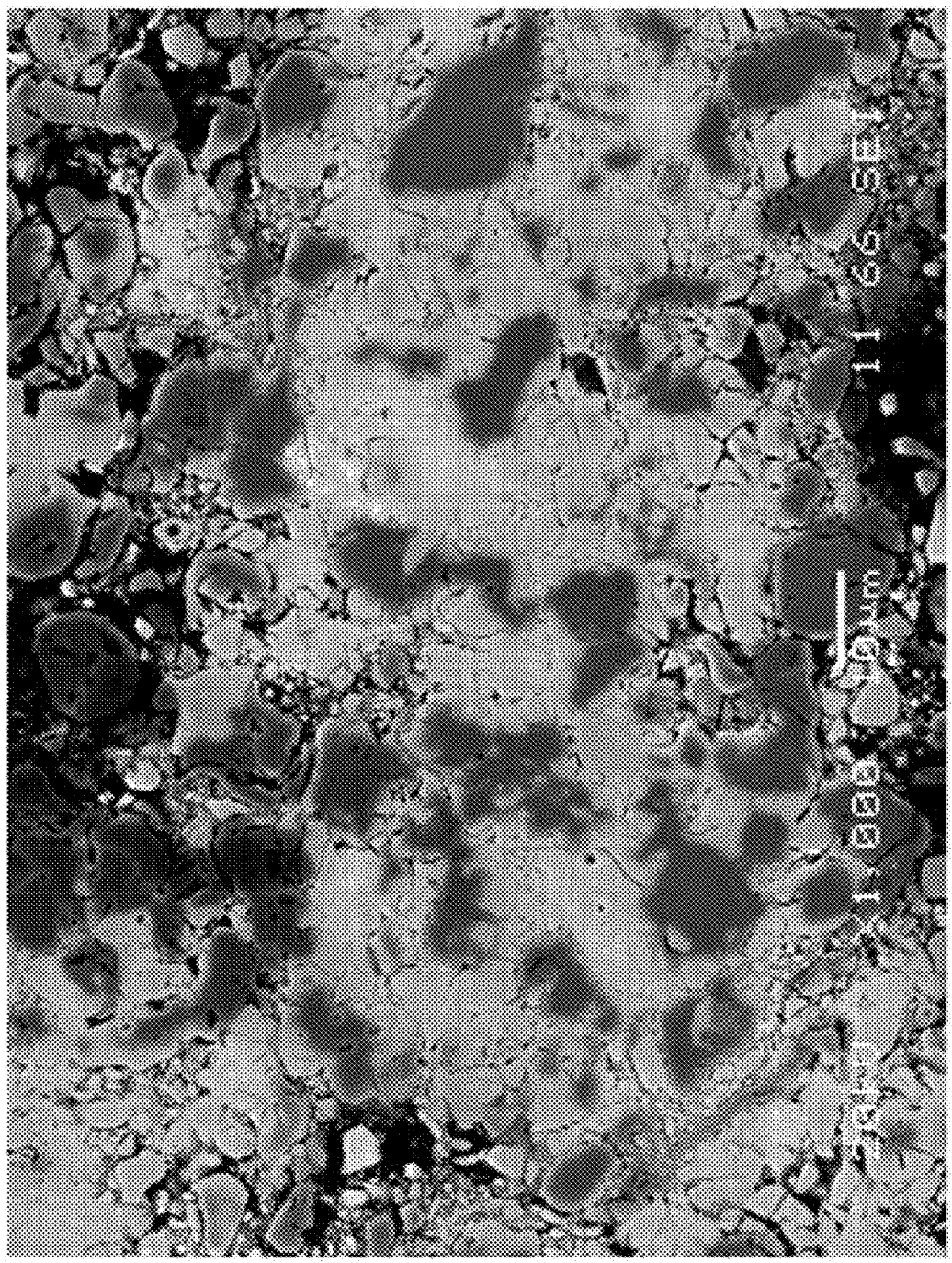
FIG. 14 shows an SEM image of a cross section of a solder paste, in accordance with the disclosure, after reflow.

FIG. 12 shows a scanning electron microscope (SEM) image of a cross section of EP1 after reflow. FIG. 13 shows an SEM image of a cross section of EP2 after reflow. FIG. 14 shows an SEM image of a cross section of EP3 after reflow. As illustrated, the solder composites have continuous or semi-continuous Cu particle chain network structures.

Samples of EP1, EP2, and EP3 were used to form solder joints between FR4 (non-metallic) and Cu coupons. The average measured shear strength (psi) of the solder joints sandwiched between FR4 or between Cu coupons is shown by Table 2.

TABLE 2

| Sample | EP1 | EP2 | EP3 |
|---|---|---|---|
| Cu volume % of | 17% | 33% | 60% |
| Substrate | FR4/FR4 | FR4/FR4 | FR4/FR4 |
| Ave (psi) | 123 | 154 | 83 |
| Std Dev (psi) | 44 | 56 | 55 |
| Substrate | Cu/Cu | Cu/Cu | Cu/Cu |
| Ave (psi) | 1315 | 578 | 341 |
| Std Dev (psi) | 256 | 25 | 31 |

The epoxy flux may provide two important functions in the solder paste described herein. First, because it is an epoxy, it provides an adhesive function in that it becomes a thermoset resin after curing. Second, it has solder fluxing power so that wettable Cu/Cu surfaces can be bonded together by solder after a reflow process. The shear strength of Cu/Cu is much higher than that of FR4/FR4, indicating that the solder fluxing power in this particular epoxy flux (756-72) is dominant. By modifying the epoxy flux formulation, it is possible to make the adhesion of the solder paste to non-metallic surfaces such as FR4 stronger. On the other hand, if both substrate surfaces already have metallized finishes, a normal solder flux may suffice in place of the epoxy flux in the solder paste formulation.

Figure 15:
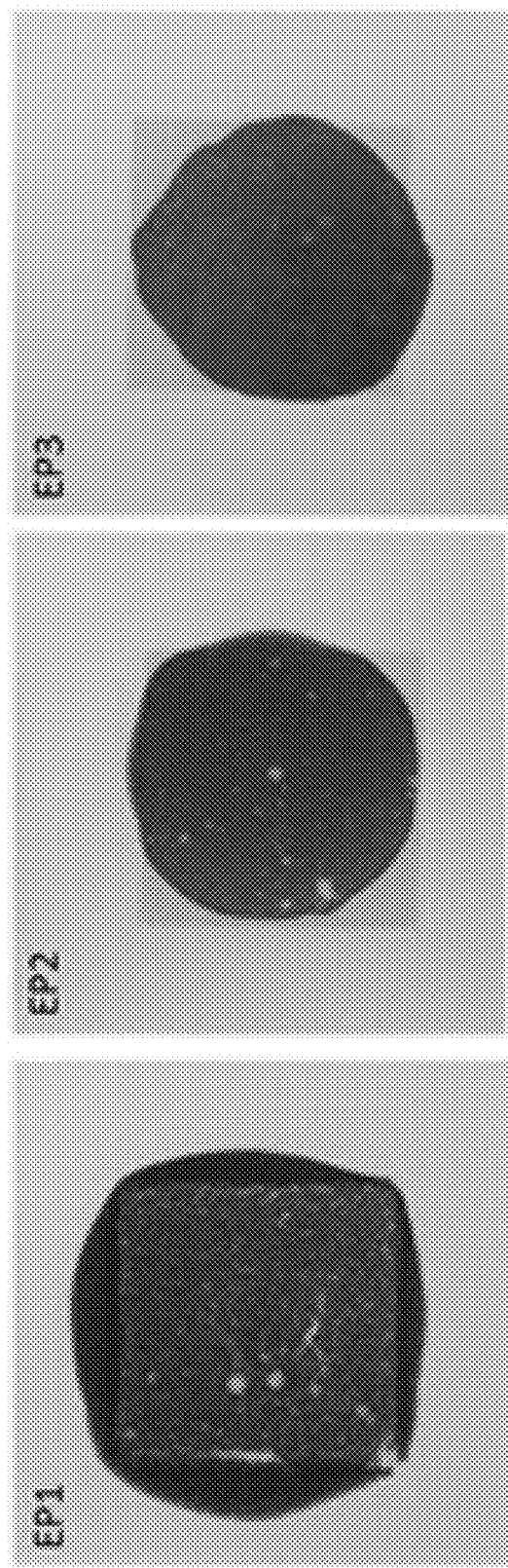
FIG. 15 includes x-ray images showing the voiding behavior observed for three samples of solder paste, in accordance with the disclosure, after i) printing the solder paste onto a ceramic coupon; ii) placing a cover glass on top of the solder paste; and iii) reflow soldering the solder paste.

The voiding behavior of sandwiched composites of each of EP1, EP2, and EP3 was studied by i) printing the solder paste onto a ceramic coupon; ii) placing a cover glass on top of the solder paste; and iii) reflow soldering the solder paste. The samples were then examined under an X-ray. FIG. 15 includes X-ray images showing the result of this study. As illustrated, all solder pastes exhibited low voiding. It should be noted that the epoxy flux 756-72 is not a 100% solvent free formulation, and it is not 100% curable. It is anticipated that by modification of the epoxy formulation, it would be possible to achieve even lower voiding results.

Table 3, below, shows the thermal conductivity k at 20° C. and 36° C. measured by ASTM D5470 for solder composites of EP1, EP2, and EP3.

TABLE 3

| Sample | EP1 | EP2 | EP3 |
|---|---|---|---|
| Cu volume % of metal | 17 | 33 | 60 |
| k at 20° C. (W/mK) | 2.9 | 5.2 | 6.1 |
| k at 36° C. (W/mK) | 2.9 | 6.1 | 6.4 |

The thermal conductivity k of the composite increases with Cu content because the k of Cu (385 W/mK) is much higher than that of SAC305 solder (58.7 W/mK).

Figure 16:
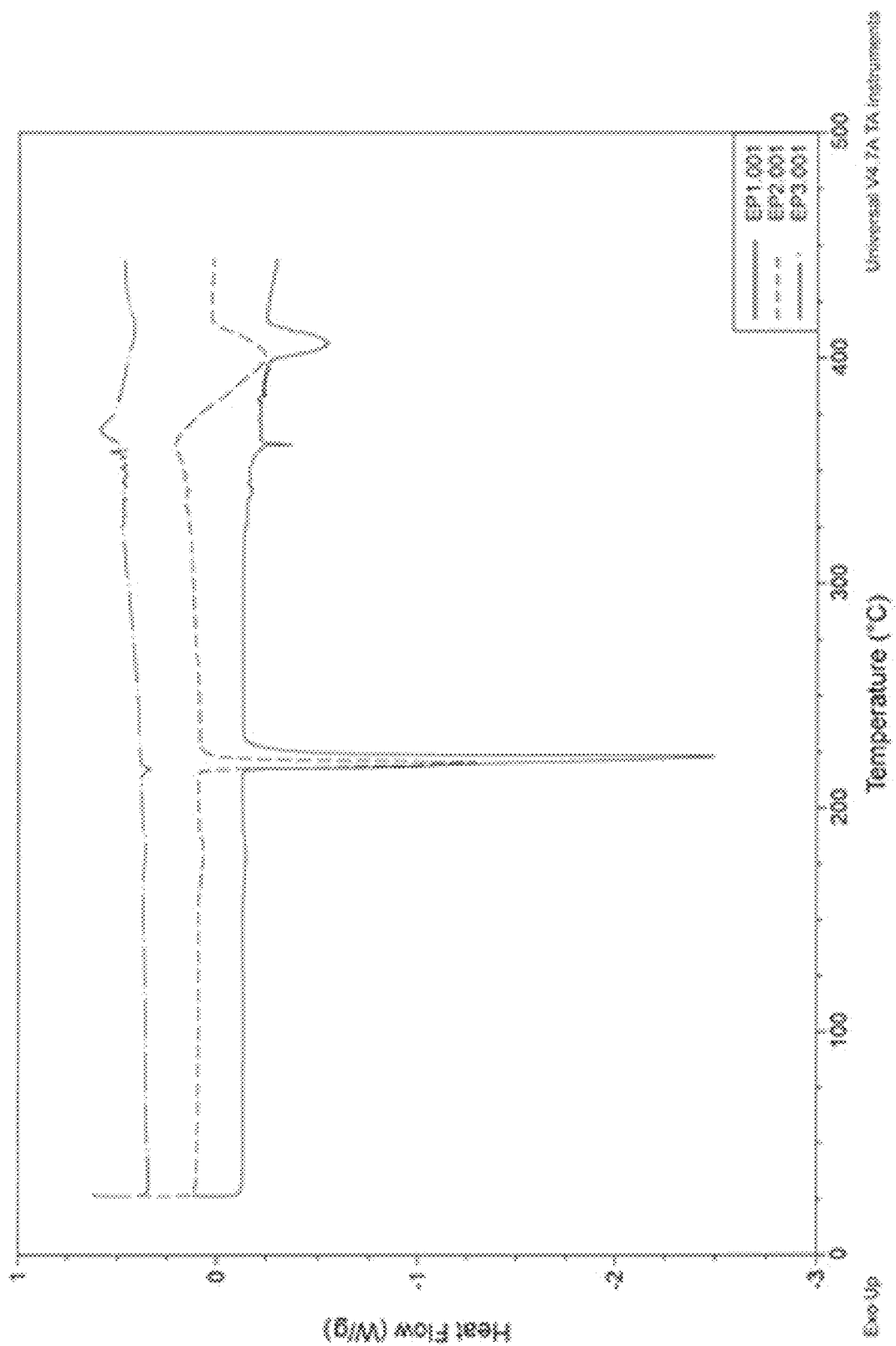
FIG. 16 shows recorded differential scanning calorimetry (DSC) curves for three solder paste samples, in accordance with the disclosure.

A differential scanning calorimetry (DSC) study was conducted on samples of EP1, EP2, and EP3. During the DSC study, a first reflow cycle was simulated by heating a paste sample to 250° C., and holding at that temperature for two minutes before cooling down the sample to 25° C. This process was repeated to simulate a second reflow cycle. Thereafter, the sample was heated at 20° C./min to 450° C., and the DSC spectrum was recorded. FIG. 16 shows the recorded DSC curves for EP1, EP2, and EP3. From the curves, it is observed that the low melting phase of SAC, with a melting peak of 217-220° C., exists for all double reflowed pastes. The continued presence of this low melting phase may make the TIM less brittle. The very small peak observed at 217-220° C. for EP3 indicates that further increasing the Cu content in the paste formulation may cause the peak to vanish.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A method, comprising:
    applying a solder paste on a non-metallized surface of a heat generating device and on a non-metallized surface of a heat transferring device to form an assembly; and
    reflow soldering the assembly to form a solder composite that, provides a thermal interface between the heat generating device and the heat transferring device,
    wherein:
        the solder paste comprises: a solder powder; particles having a higher melting temperature than a soldering temperature of the solder paste; and epoxy flux,
        the solder paste has a volume ratio of the solder powder to the particles that is 5:1 to 2:1,
        the particles comprise a copper or copper-alloy powder,
        the solder powder comprises an alloy including Sn, Ag, and Cu,
        during reflow, the solder powder melts and wets to the copper or copper-alloy powder to form a CuSn intermetallic compound, and
        a low melting temperature phase of the alloy remains in the solder composite.

2. The method of claim 1, wherein reflow soldering the assembly comprises reflow soldering the assembly at a peak temperature of 250° C. or less.

3. The method of claim 1, further comprising: after forming the solder composite, reflow soldering the assembly a second time at or above a melting temperature of the solder powder, wherein the CuSn intermetallic compound is configured to prevent pump-out of solder from the solder composite when reflow soldering the assembly the second time.

4. The method claim 1, wherein during reflow, the epoxy flux cures after the solder powder melts and wets to the copper or copper-alloy powder to form the CuSn intermetallic compound.

5. The method of claim 1, wherein the heat generating device comprises a die, and the heat transferring device comprises a heat spreader.

6. The method of claim 5, wherein applying the solder paste comprises:
    dispensing the solder paste on the die; and
    placing a housing of the heat spreader on the solder paste to form the assembly.

7. The method of claim 6, wherein the dispensing the solder paste comprises dispensing the solder paste on a non-metallized surface of the die.

8. An assembly, comprising:
    a heat generating device;
    a heat transferring device; and
    a solder composite on non-metallized surfaces of the heat generating device and heat transferring device, wherein:
        the solder composite provides a thermal interface between the heat generating device and the heat transferring device,
        the solder composite is formed by reflow soldering a solder paste comprising: a solder powder; particles having a higher melting temperature than a soldering temperature of the solder paste; and epoxy flux,
        the solder paste has a volume ratio of the solder powder to the particles that is 5:1 to 2:1,
        the particles comprise a copper or copper-alloy powder,
        the solder powder comprises an alloy including Sn, Ag, and Cu,
        the solder composite comprises a CuSn intermetallic compound formed during reflow by the solder powder melting and wetting to the copper or copper-alloy powder; and
        a low melting temperature phase of the alloy is in the solder composite.

9. The assembly of claim 8, wherein the assembly is a chip carrier, the heat generating device comprises a die, and the heat transferring device comprises a heat spreader.

10. The assembly claim 9, wherein the solder composite is on non-metallized surfaces of the die and heat spreader.

11. A solder composite formed by a process, the process comprising:
    applying a solder paste on a non-metallized surface of a heat generating device and on a non-metallized surface of a heat transferring device to form an assembly; and
    reflow soldering the assembly to form the solder composite that provides a thermal interface between the heat generating device and the heat transferring device,
    wherein:
        the solder paste comprises: a solder powder; particles having a higher melting temperature than a soldering temperature of the solder paste; and epoxy flux,
        the solder paste has a volume ratio of the solder powder to the particles that is 5:1 to 2:1,
        the particles comprise a copper or copper-alloy powder,
        the solder powder comprises an alloy including Sn, Ag, and Cu,
        during reflow, the solder powder melts and wets to the copper or copper-alloy powder to form a CuSn intermetallic compound, and
        a low melting temperature phase of the alloy remains in the solder composite.

* * * * *